United States Patent [19]
Kong

[11] Patent Number: 5,859,548
[45] Date of Patent: Jan. 12, 1999

[54] CHARGE RECYCLING DIFFERENTIAL LOGIC (CRDL) CIRCUIT AND DEVICES USING THE SAME

[75] Inventor: Bai-Sun Kong, Seoul, Rep. of Korea

[73] Assignee: LG Semicon Co., Ltd., Cheongju, Rep. of Korea

[21] Appl. No.: 688,881

[22] Filed: Jul. 31, 1996

Related U.S. Application Data

[60] Provisional application No. 60/022,565 Jul. 24, 1996.

[51] Int. Cl.[6] .................................................. H03K 19/094
[52] U.S. Cl. ............................. 326/113; 326/95; 326/98; 365/205
[58] Field of Search ........................... 326/95, 98, 113; 365/205, 207

[56] References Cited

U.S. PATENT DOCUMENTS

| | | | |
|---|---|---|---|
| 3,796,893 | 3/1974 | Hoffman et al. | 307/205 |
| 4,169,233 | 9/1979 | Harszti | 307/355 |
| 4,355,377 | 10/1982 | Sud et al. | 326/98 |
| 4,561,702 | 12/1985 | McAdams | 307/475 |
| 4,570,084 | 2/1986 | Griffin et al. | 326/98 |
| 4,734,597 | 3/1988 | Ullrich et al. | 307/481 |
| 5,049,763 | 9/1991 | Rogers | 307/443 |
| 5,162,681 | 11/1992 | Lee | 307/530 |
| 5,502,680 | 3/1996 | Du et al. | 365/205 |
| 5,526,314 | 6/1996 | Kumar | 365/207 |
| 5,594,361 | 1/1997 | Campbell | 326/24 |
| 5,650,971 | 7/1997 | Longway | 365/207 |

OTHER PUBLICATIONS

Saed G. Younis et al., "Practical Implementation of Charge Recovering Asymptotically Zero Power CMOS" Research on integrated systems; Proc. 1993 Symp., Cambridge, MA 1993 pp. 234–250.

Kawahara, T., et al., "A Charge Recycle Refresh for Gb–Scale DRAM's in File Applications," IEEE J. Solid–State Circuits, vol. 29, No. 6, Jun. 1994, pp. 715–722.

*Primary Examiner*—David Nelms
*Assistant Examiner*—Hoai V. Ho
*Attorney, Agent, or Firm*—Fleshner & Kim

[57] ABSTRACT

A novel logic family, called Charge Recycling Differential Logic (CRDL) circuit, reduces power consumption by utilizing a charge recycling technique and has a speed comparable to those of conventional dynamic logic circuits. The CRDL circuit also has improved noise margin due to inherently static operation. An 8-bit Manchester carry chains and full adders were fabricated using a 0.8 μm single-poly double-metal n-well CMOS technology. The measurement results indicate about 16–48% improvements in power-delay product are obtained compared with Differential Cascode Voltage Switch (DCVS) circuit.

33 Claims, 17 Drawing Sheets

P: Precharge
E: Evaluate

| a | b | XOR OUT | XNOR /OUT |
|---|---|---------|-----------|
| 0 | 0 | 0 | 1 |
| 0 | 1 | 1 | 0 |
| 1 | 0 | 1 | 0 |
| 1 | 1 | 0 | 1 |

| a | b | AND OUT | NAND /OUT |
|---|---|---------|-----------|
| 0 | 0 | 0 | 1 |
| 0 | 1 | 0 | 1 |
| 1 | 0 | 0 | 1 |
| 1 | 1 | 1 | 0 |

CHARGE RECYCLING DIFFERENTIAL LOGIC (CRDL) CIRCUIT AND DEVICES USING THE SAME

This is a regular application based on a provisional application under 37 CFR 1.53(b)(2) having Ser. No. 60/022,565 filed Jul. 24, 1996, and this regular application claims priority thereof.

TECHNICAL FIELD

The present invention relates to a logic cell, and more particularly, to a charge recycling differential logic (CRDL) circuit and devices using the same.

BACKGROUND ART

VLSI technology allows powerful hardware for sophisticated computer applications and multimedia capabilities, such as realtime speech recognition and full-motion video. The changes in computing environment has created a variety of high speed electronics applications. However, there is an increased user desire for portability of computational equipment.

The requirement of portability places severe restrictions on size, weight, and power. Of these, power consumption is a dominant consideration in mobile applications since current battery technology can not provide sufficient energy to run such systems for an acceptably long time. Hence, the traditional mainstay of portable digital applications has been in low-power, low-throughput uses, such as wristwatches and pocket calculators.

A number of portable applications, however, requires low-power and high-throughput, simultaneously. For example, notebook and laptop computers require almost the same computation speed and capabilities as of desktop machines. Equally demanding are developments in personal communications services(PCS's), such as the digital cellular telephony networks which employ complex speech compression algorithms and sophisticated radio modems.

Further, more power is required for the portable multimedia systems supporting full-motion digital video. Power for video compression and decompression and speech recognition is required on top of the already lean power budget. These portable systems have increased capabilities than fixed workstations, and are required to operate in a low power portable environment.

Even in non-portable systems, low power consumption is becoming critical. Until recently, power consumption has not been a great concern since the heat generated on-chip can be sufficiently dissipated using a proper package. However, the reduction in the minimum feature size allows implementation of more functional units in a single chip by increasing the number of integrated transistors.

These functional units are usually computation-intensive and operating concurrently, and power consumption increases dramatically in complex VLSI systems, such as high performance microprocessors and general-purpose digital signal processors (DSP's). Since the power dissipated in a CMOS digital circuit is proportional to the clock frequency, higher operational speed further increases power consumption.

Further, some adequate cooling techniques, such as using fins and fans, are required to handle increased internal heat. Such techniques increase cost and/or limit the amount of functionalities which can be integrated in a single chip. Hence, reducing power consumption has become a critical concern for designing complex VLSI systems.

There are a variety of considerations that must be taken into account for low power design, which include the style of logic used, the technology incorporated, and the architecture employed. Among these, choosing a proper logic style is one of the most important factors for low power, since the power consumed in the arithmetic and logical units is greatly dependent on the way in which these blocks are implemented. The logic circuit choice also affects the architectural selection. Hence, full exploitation of existing logic circuits for optimization and efforts to create a new logic circuit for low power operation are inevitably required.

There are a number of options available in choosing the basic circuit approach and topology of implementing various logic and arithmetic functions. In general, logic families can be divided into two broad category, depending on the type of operation. The first category is a static logic circuit including standard CMOS logic and pass-transistor logic, in which all the internal nodes are static, and thus, noise margin is high. The second category is a dynamic logic circuit which uses precharge technique to improve speed performance. However, the cost increases due to higher design complexity in order to eliminate the problems, such as charge sharing due to dynamic operation.

The simplest form of static logic is the standard CMOS logic having both pMOS and nMOS transistors in a dual form. For example, FIG. 1A shows the structure of a 2-input NAND gate. The standard CMOS logic circuit is disadvantageous since a large number of transistors is required to implement a given Boolean logic function. Further, the width of the pMOS transistor used for the pull-up function must be two or three times larger than the nMOS transistor to make the rise and fall times similar to each other since the pMOS has relatively low current driving capability. Such compensation increases the area to implement the standard CMOS logic, compared to the conventional nMOS logic to achieve the same Boolean logic function. Moreover, the operational speed may be too slow due to an increase in parasitic capacitance.

A Differential Cascode Voltage Switch (DCVS) logic circuit, as shown in FIG. 1B, solves the problem of the standard CMOS circuit. However, the DCVS logic circuit is actually slower and dissipates more power than the standard CMOS logic circuit. During the switching action, the p-channel pull-up transistors must fight against the pull-down logic tree of the nMOS cascode logic network. The signal fighting at the output prolongs the time period for logic evaluation and causes a substantial short-circuit current, increasing the power dissipation.

Another known CMOS logic circuit is a pass-transistor logic. A simple example of this logic circuit is a 2-input multiplexer, i.e., an XOR gate, as illustrated in FIG. 1C. However, the pass logic circuit is disadvantageous due to low current driving capability, resulting in speed degradation. Thus, drivers must be inserted periodically between the stages. Further, the n-channel device cannot drive the logic 'high' effectively such that the voltage swing is sacrificed.

The Complementary Pass-Transistor Logic (CPL) circuit solves the problem of the nMOS version of the pass-transistor logic. The CPL uses an nMOS pass-transistor network with low threshold voltage to reduce the voltage drop on logic high level at the output. The CPL consists of a complementary nMOS pass-transistor logic network and two CMOS output inverters, as shown in FIG. 1D. The pass-transistors function as pull-up and pull-down devices. The output inverters shift the logic threshold voltage and are used as buffers to drive the capacitive load.

The dynamic logic circuits have some common basic features. All dynamic logic circuits involve precharging the output nodes to a particular level (usually up to supply voltage), while the current path to ground is turned off. At the completion of precharge, the path to the high level is cut off and the path to the ground is turned on. Depending on the state of the inputs, the output will either be floating at the precharged level or be pulled down to ground. Since the load capacitance is reduced by a factor of two or three, the gate responds roughly twice as fast as the static logic circuit.

FIGS. 2A–2D illustrate different types of dynamic logic circuits. A CMOS domino circuit shares the basic characteristics of the dynamic logic circuit. A single domino logic circuit is shown in FIG. 2A. Another type of dynamic logic circuit is a clocked version of the DCVS circuit, which is similar to static DCVS except a clock signal drives pull-up pMOS transistors instead of cross-coupled connection between these transistors, as shown in FIG. 2B. FIG. 2C illustrates a sample-set differential logic (SSDL), which is a modification of the clocked DCVS. A Latched CMOS differential logic (LCDL) circuit of FIG. 2D uses similar type of sense amplifier to improve speed performance.

Although the above logic circuits attempt to reduce the amount of charge consumed in each cycle, power consumption is large, since the charge is repeatly moved from the supply voltage to the ground voltage within a given cycle. Younis and Knight at MIT proposed a method of charge recovering via a new logic family, called Charge Recovering Logic (CRL), which was described in the articles entitled "Practical implementation of charge recycling Asymptotically zero power CMOS," Research on integrated systems; Proc. 1993 Symp., Cambridge, Mass. 1993.

The charge recovery technique can achieve energy saving of over 99% when switched sufficiently slowly. The concept is to create a mirror image of a circuit that computes the inverse of the original, as shown in FIG. 3A. As each stage in the circuit finds an answer, it passes the result on to its mirror image which computes the inverse. In the main circuit charge moves toward the end, while charge is recycled back to the beginning in the mirror circuit. However, the logic design for implementing the CRL is quite impractical, and the anticipated power saving is nearly impossible to be realized in ordinary applications.

Succeeding refinements for saving and reusing only a fraction of the charge seem to be compatible with conventional CMOS technology. An example is a Reduced-Power Buffer (RPB), illustrated in FIG. 3B, which uses storage capacitor to save some of the charges otherwise being dissipated. This circuit includes a driver with an additional storage capacitor attached to the output node through a switch T1. During a high-to-low transition, the circuit saves some of the charge into the storage capacitor Cs, instead of dissipation to the ground. Just before the next low-to-high transition, the saved charge is recycled to the output node.

This scheme is only useful to the applications dominated by switching of large capacitive loads, and the storage capacitor must be relatively larger than the load capacitor to obtain sufficient power saving. Another example is a refresh scheme in DRAM to recycle the charge used to refresh cells in one array for use in the other array, which is described in an article entitled "A charge Recycle Refresh for Gb-Scale DRAM's in File Applications," IEEE Journal of Solid State Circuits, Vol. 29, No. 6, June 1994, by Kawahara et al. However, there is no practical charge recycling scheme for general use in logic circuit design.

DISCLOSURE OF THE INVENTION

An advantage of the present invention is in decreasing the power consumption of a logic circuit.

Another advantage of the present invention is in increasing the speed of a logic circuit.

A further advantage of the present invention is in reducing the di/dt noise of a logic circuit.

Still another advantage of the present invention is in eliminating the noise sensitive dynamic nodes of a logic circuit.

Still a further advantage of the present invention is in easily implementing any logic function.

The present invention is achieved at least in part by a logic circuit operating under a clock signal of first and second levels, comprising first and second nodes; means for pulling-up the first node to a first potential when the clock signal transits from the first level to the second level; means for pulling-down the second node to a second potential when the clock signal transits from the first level to the second level; and means for equalizing the first and second nodes to a third potential between the first and second potentials when the clock signal transits from the second level to the first level.

The present invention can be also achieved at least in part by a logic circuit comprising first and second nodes; a pair of cross-coupled first and second transistors coupled to the first and second output nodes; a third transistor coupled to the first and second transistors, the third transistor equalizing the first and second nodes to potentials which are about equal to one another; and a logic network coupled to the first and second nodes for implementing a predetermined logic function.

In accordance with the present invention, a method for recycling charges stored in first and second parasitic capacitors of first and second nodes, respectively, comprises the steps of: pulling-up the first node to a first potential when a clock signal transits from a first level to a second level; pulling-down the second node to a second potential when the clock signal transits from the first level to the second level; and equalizing the first and second nodes to a third potential between the first and second potentials when the clock signal transits from the second level to the first level.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

The choice of a logic style for implementing the logic functions depends on many criteria, such as speed, power, testability, and ease of design. To reduce power consumption, factors such as the supply voltage, parasitic capacitance, switching activity of operation, short-circuit current, and ease of applying power-down mode, etc., are of major concern. The consideration for the speed should not be omitted since the important criterion is not only the power consumption per unit time, but the energy being required to do a given operation.

Figure 1A:
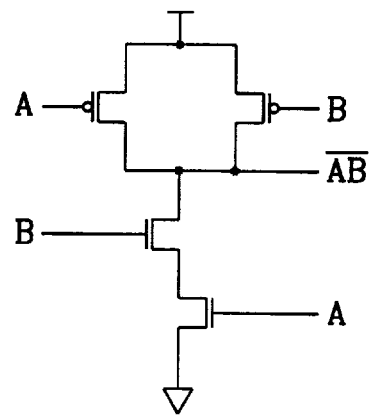
FIG. 1A is a schematic of a two-input NAND gate with standard CMOS logic.
Figure 1B:
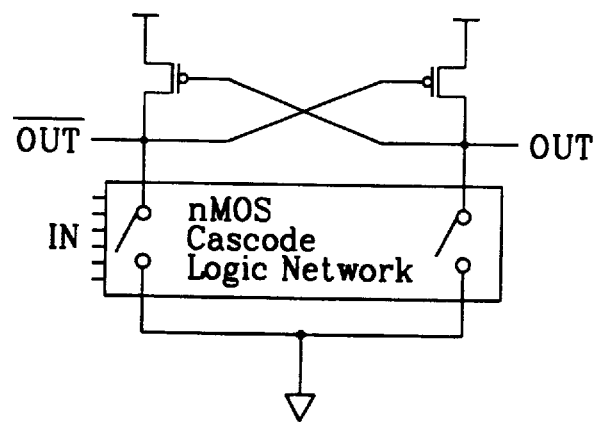
FIG. 1B is a schematic of a Differential Cascode Voltage Switch (DCVS) logic circuit.
Figure 1C:
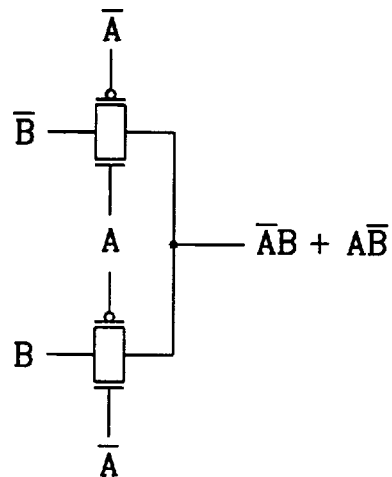
FIG. 1C is a schematic of a two-input multiplexer with CMOS pass-transistor logic circuit.
Figure 1D:
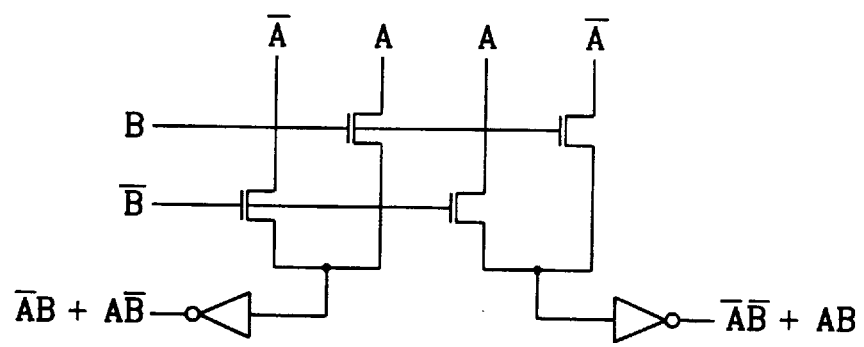
FIG. 1D is a schematic of a complementary pass transistor logic circuit.
Figure 2A:
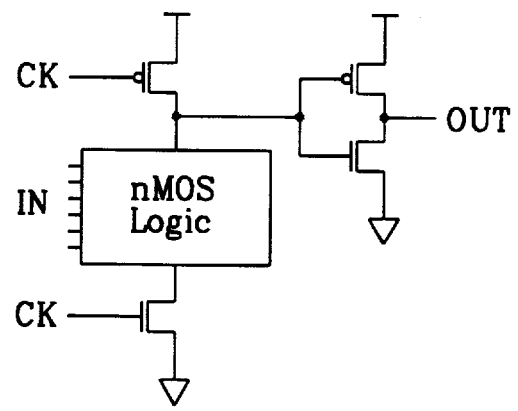
FIG. 2A is a schematic of a CMOS domino logic circuit.
Figure 2B:
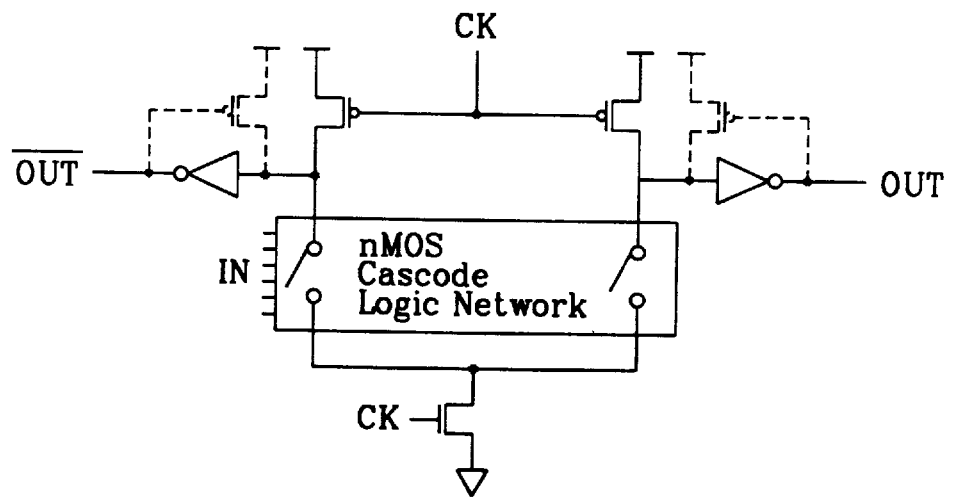
FIG. 2B is a schematic of a clocked DCVS circuit.
Figure 2C:
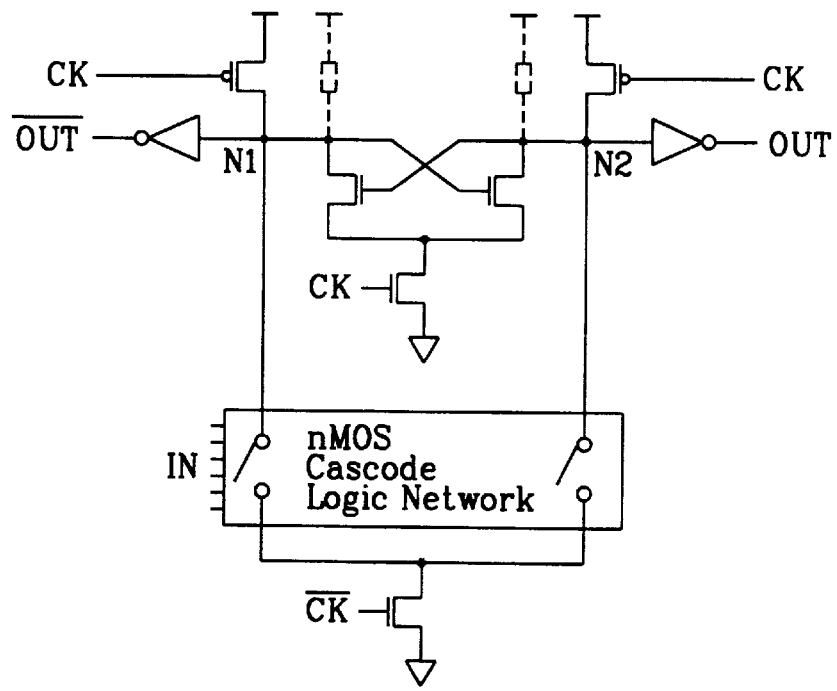
FIG. 2C is a schematic of a sample-set differential logic circuit.
Figure 2D:
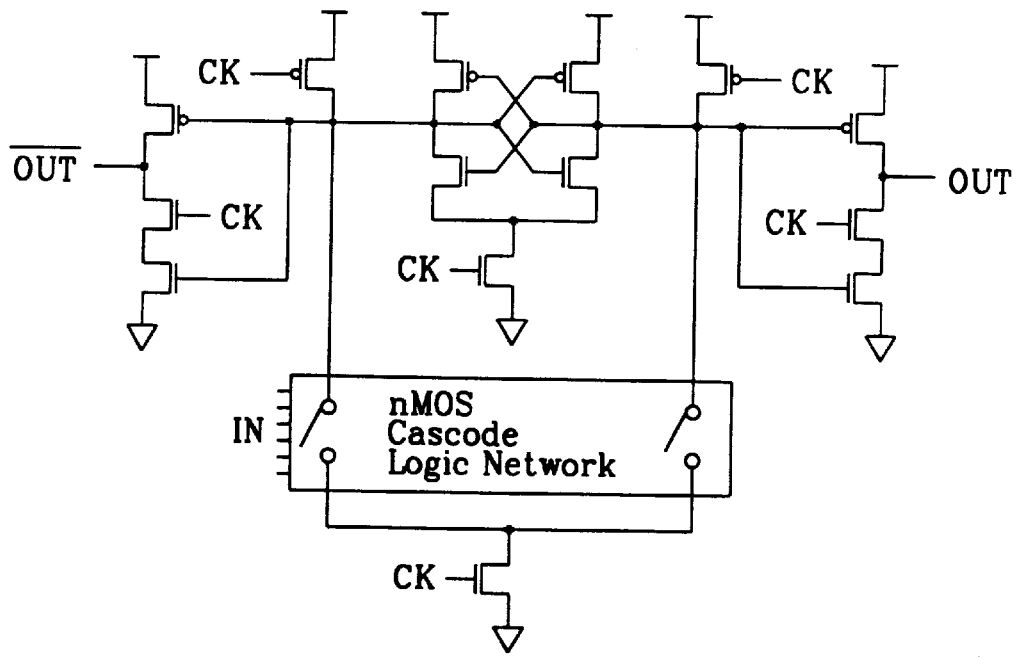
FIG. 2D is a schematic of a pseudo-one-phase latched CMOS differential logic circuit.
Figure 3A:
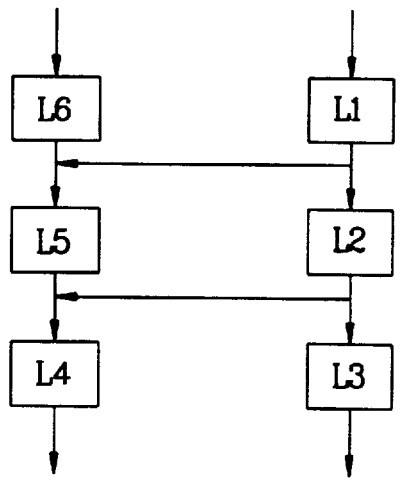
FIG. 3A illustrates the concept of the charge recovering technique.
Figure 3B:
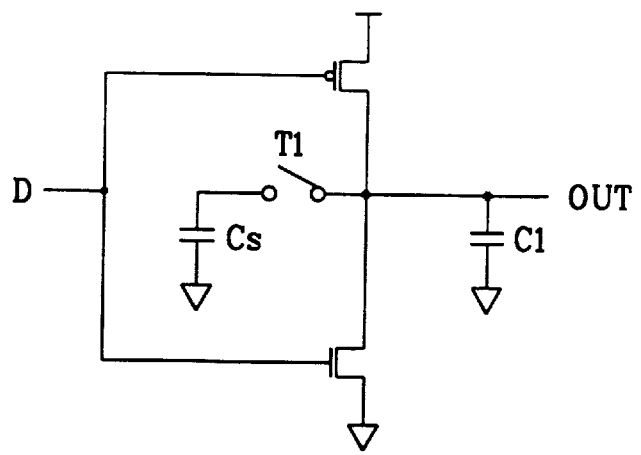
FIG. 3B is a simplified transistor-level schematic of a reduced power buffer.
Figure 4A:
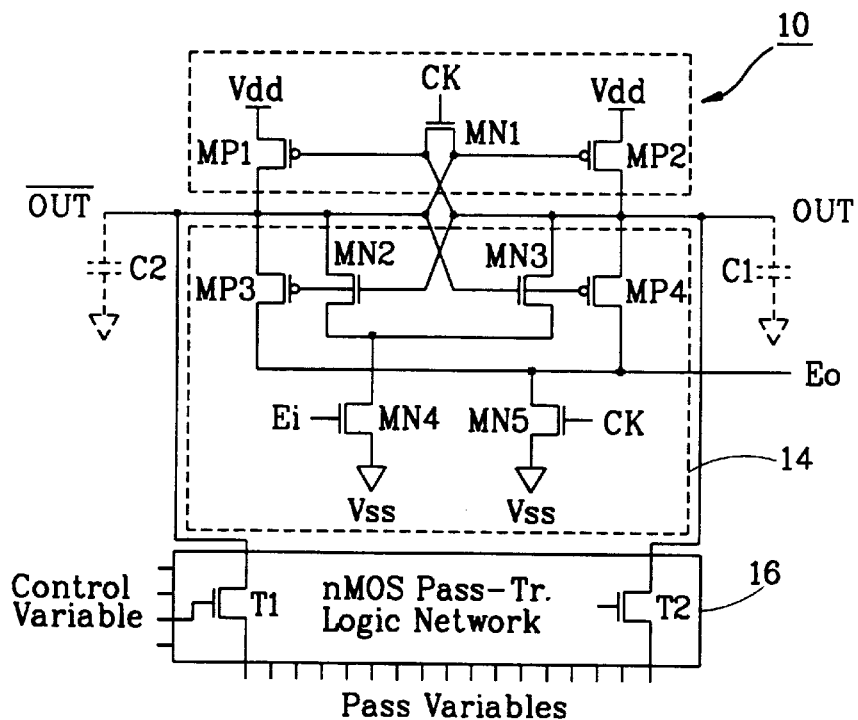
FIG. 4A is schematic of a Charge Recovery Differential Logic (CRDL) circuit in accordance with an embodiment of the present invention.

FIG. 4A illustrates a generic Charge Recycling Differential Logic (CRDL) circuit 10 in accordance with the present invention. The CRDL includes a complementary output pass-transistor logic network 16 with a precharging circuitry 12, and an acceleration buffer 14. There are two types of inputs to the pass-transistor logic network: (1) control variables and (2) pass variables to implement a particular logic function.

The precharging circuitry 12 consists of a cross-coupled pair of the pMOS transistors MP1 and MP2 connected to the output nodes /OUT and OUT, respectively, and an nMOS transistor MN1 connected to the gates of transistors MP1 and MP2. The cross-coupled pair MP1 and MP2 pulls one of the complementary output nodes /OUT or OUT up to Vdd as the other goes down to Vss, while the nMOS transistor MN1 is used to equalize the voltages of the output nodes OUT and /OUT to about half the supply voltage Vdd. The threshold voltages of the pMOS transistors MP1 and MP2 in the cross-coupled pair are relatively higher than other transistors. In other word, the pMOS transistors MP1 and MP2 are nearly off when the two complementary output nodes OUT and /OUT are precharged to half Vdd. The capacitors C1 and C2 are parasitic capacitances of the output nodes OUT and /OUT, respectively. The parasitic capacitances may or may not be equal to each other.

The nMOS pass transistor logic network 16 operates faster than a cascode logic network. However, when used in a long chain of a buffer, the speed of the CRDL circuit 10 is degraded. The acceleration buffer 14 may be added to increase the operational speed of the CRDL circuit 10. The acceleration buffer 14 is activated by an enable signal Ei, and the signal Eo is the output signal for use as the enable signal Ei in the next stage. The transistors MN2, MN3, and MN4 form the sense amplifier to accelerate a pull-down transition, and transistors MP3, MP4, and MN5 are used to generate the enable signal for the amplifier in the next stage. The enable signal Ei disables the transistor MN4 in the precharge phase and enables the transistor MN4 in a self-timed manner during the evaluation phase to accelerate the pull-down transitions of output nodes OUT and /OUT.

The CRDL circuit 10 has two phases of operation, i.e., a precharge phase and a evaluation phase. During the precharge phase, the clock signal CK goes high, connecting the two output nodes OUT and /OUT through the nMOS transistor MN1. By the charge sharing effect, the voltage levels of both output nodes OUT and /OUT become equal. Since the outputs are complementary, the output nodes OUT and /OUT reach a voltage level in-between Vdd and Vss, assuming that the parasitic capacitance of each node is comparable. If so, voltage of the output nodes reach about half Vdd. If not, the pMOS transistors in the cross-coupled pair turn on, and supply an additional charge to the precharge nodes making the voltage closer to half Vdd. After reaching the required voltage level, output nodes experience no subsequent pull-up because the cross-coupled pMOS transistors MP1 and MP2, having higher threshold voltages, turn off immediately.

In the evaluation phase, the clock signal CK goes low such that the transistor MN1 turns off to separate the precharged nodes OUT and /OUT from each other. Then, depending on the applied input values, a low impedance path to ground is established at one of the two precharged nodes through the pass-transistor network 16, pulling down the node toward ground. As an example, if the output node /OUT is to be evaluated low, the lowering of the voltage level at this node turns on the pMOS transistor MP2 in the cross-coupled pair, pulling up the output node OUT. When the enable input signal Ei goes high, the transistor MN4 is turned on to activate the sense amplifier. Through the regenerative action of the sense amplifier, the output node /OUT is pulled down quickly toward ground. As the voltage difference between the output nodes OUT and /OUT becomes larger, the transistor MP4 in the acceleration buffer turns on to generate the output Eo, which is to be used for activating the sense amplifier in the next stage.

As described above, the acceleration buffer is used to increase the speed of the CRDL circuit, and is not necessary required in the CRDL circuit. However, when used, the timing of the output signal Eo from the previous stage must meet certain constraints for reliable operations. For speed, a faster Ei signal is most suitable to achieve high performance. However, if the sense amplifier is enabled too fast, the amplifier may not sense the logic states correctly, leading to false output values. Thus, the enable signal Ei must be enabled after a sufficient voltage difference between the output nodes OUT and /OUT.

To assure reliable operation, the output signal Eo of the previous stage is usually used as the enable signal Ei for the current stage. The enable signal Ei for the current stage can be applied from the 2nd or 3rd previous stages, instead of the 1st previous stage to achieve the highest possible speed, assuming no timing constraint is violated. If the output signal Eo from the previous stage cannot meet the timing constraint, the propagation delay can be adjusted by changing the size of the transistors in the acceleration buffer 14, or by inserting a proper delay element.

Figure 4B:
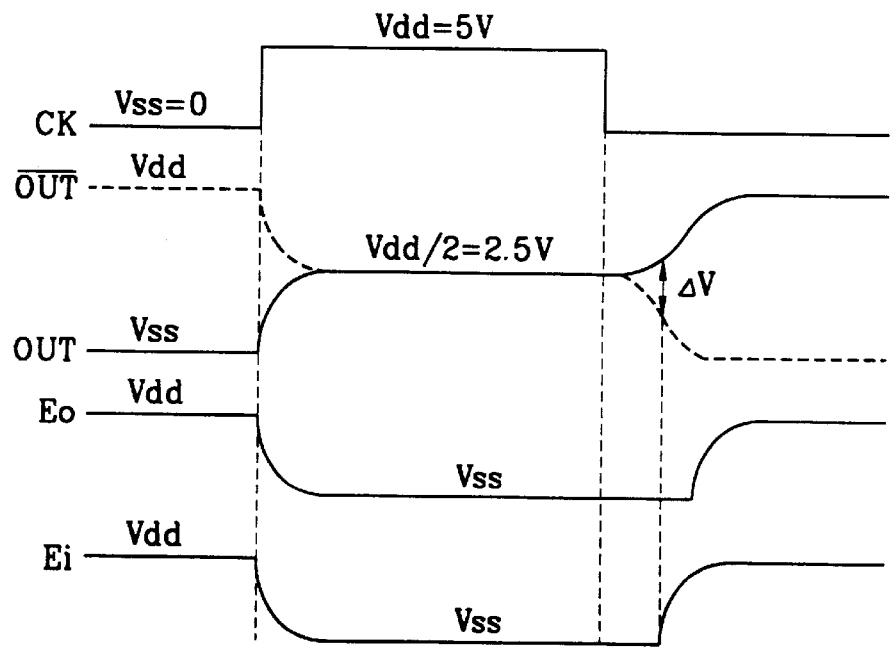
FIG. 4B is an operational timing diagram of the CRDL circuit illustrated in FIG. 4A.

With reference to FIG. 4B, the operation of the CRDL circuit 10 of FIG. 4A is as follows, assuming Vdd is about 5 V and the nMOS pass transistor logic network 16 comprises nMOS transistors T1 and T2, where the gate and drain of each transistor is coupled to the control variables and pass variables, respectively. The control and pass variables may be connected to the output nodes of a previous stage.

When the clock signal CK is low, the CRDL circuit is in an evaluation phase. During this phase, the transistor MN1 is off, and the output nodes OUT and /OUT are separated from each other. The potential of OUT and /OUT are 0 V and 5 V, respectively. The enable signal Ei and the output signal Eo are both at about 5 V.

When the clock signal CK changes to a low signal, the CRDL circuit 10 operates in a precharge phase. The transistor MN1 is turned on, and the output nodes OUT and /OUT are connected to each other. Hence, the charge stored in the parasitic capacitor C2 of the output node /OUT is shared with the parasitic capacitor C1 of the output node OUT until the potential at each node reaches about half Vdd, i.e., 2.5 V. During the precharge phase, the transistors MP3, MN2, MN3, MP4, MN4 and MN5 are all off, and the enable signal Ei and the output signal Eo drop to 0 V.

When the clock signal changes to a low signal, the voltage applied to the gate and drain of the transistor T1 increases to 5 V and decreases to 0 V, respectively, while the voltage applied to the gate and drain of the transistor T2 decreases to 0 V and increases to 5 V, respectively. Hence, the transistors T1 and T2 are turned on and off, respectively. Since current flows through the transistor T1, the potential at the output node /OUT goes down to 0 V, causing transistor MP2 to be turned on. A current flow through the transistor MP2 increases the potential at the output node OUT to 5 V.

As shown, the pull down of the output node /OUT is faster than the pull up of the output node OUT. For reliable operation, the enable signal Ei should be applied when there is a certain voltage deviation ΔV between the output nodes OUT and /OUT. When the enable signal Ei of 5 V is applied, the transistor MN4 is turned on. The transistor MN5 is turned off due to a clock signal of a low level. Since the gates of transistors MP3 and MN2 are coupled to the output node OUT, the transistors MP3 and MN2 are turned off and on, respectively. Similarly, since the potential at the output node /OUT decreases to 0 V, the transistors MN3 and MP4 are turned off and on, respectively. As a result, the pull down operation is accelerated, and the output signal Eo of high is generated. As shown in FIG. 4B, there is a timing difference between the enable signal Eo and the output signal Eo.

As illustrated above, the transistor MN1 functions as an equalization transistor to allow the sharing of charges between the parasitic capacitances of the output nodes OUT and /OUT. The cross-coupled pair of transistors MP1 and MP2 allows precise precharge level of about ½(Vdd−Vt), where Vt is the threshold voltage of the transistors MP1 and MP2, during the precharge phase. During the evaluation phase, the transistors MP1 and MP2 supply current for a pull-up function. The pull-down function is accomplished by the nMOS pass transistor logic network 16.

As discussed above, the threshold voltages of transistors MP1 and MP2 are relatively higher than the other transistors. To adjust the threshold voltage, an extra implantation process can be carried out. However, such an additional process step may be too costly. As known to one of ordinary skill in the art, back bias or other techniques can be used to control the threshold voltage of the transistors MP1 and MP2 to be higher than the precharge level at the output nodes OUT and /OUT.

Figure 4C:
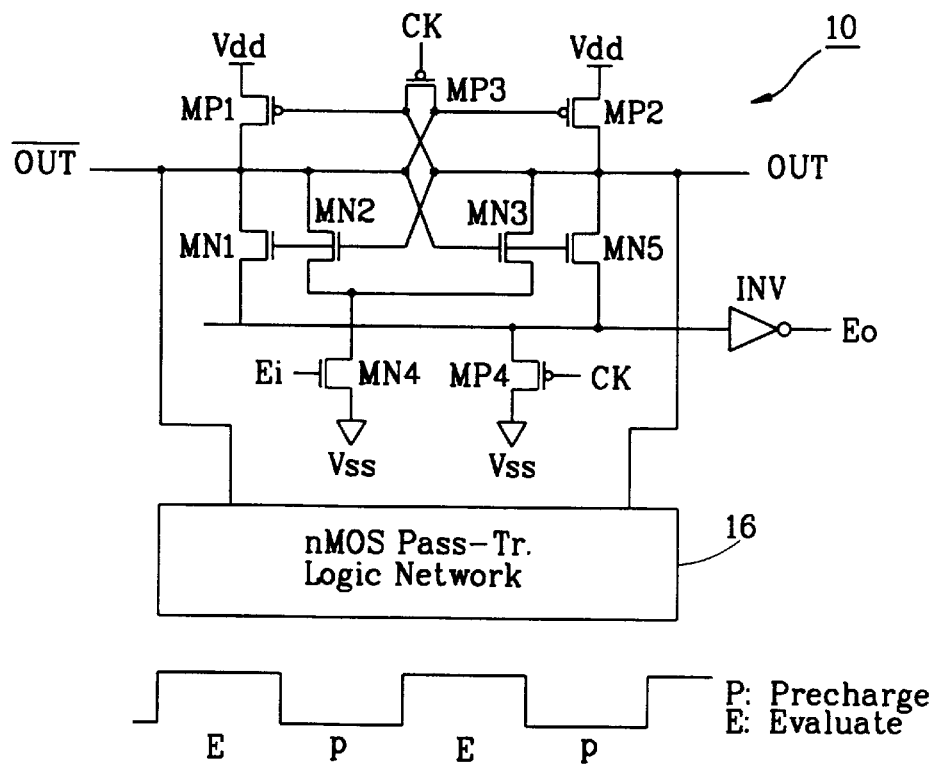
FIGS. 4C–4E are schematics of different embodiments of the CRDL circuit.
Figure 4D:
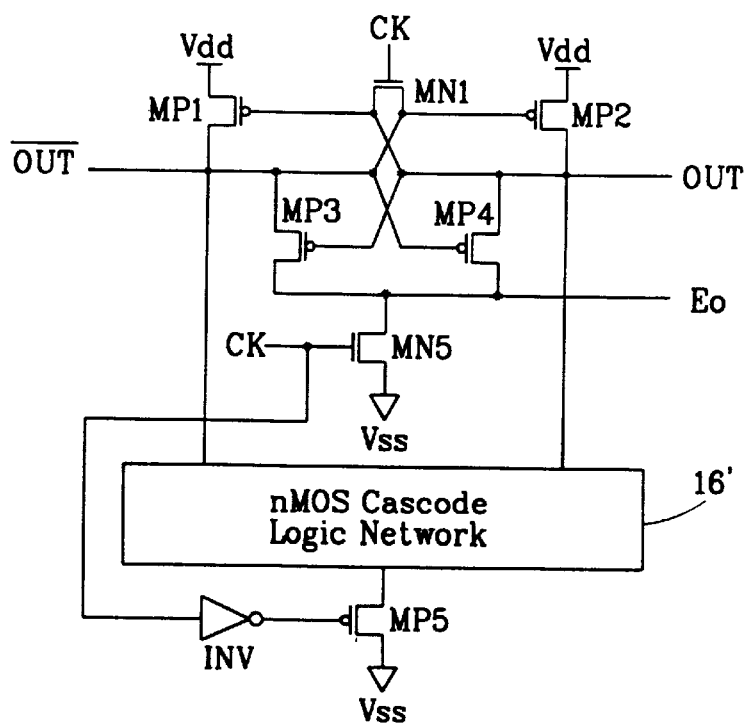
Figure 4E:
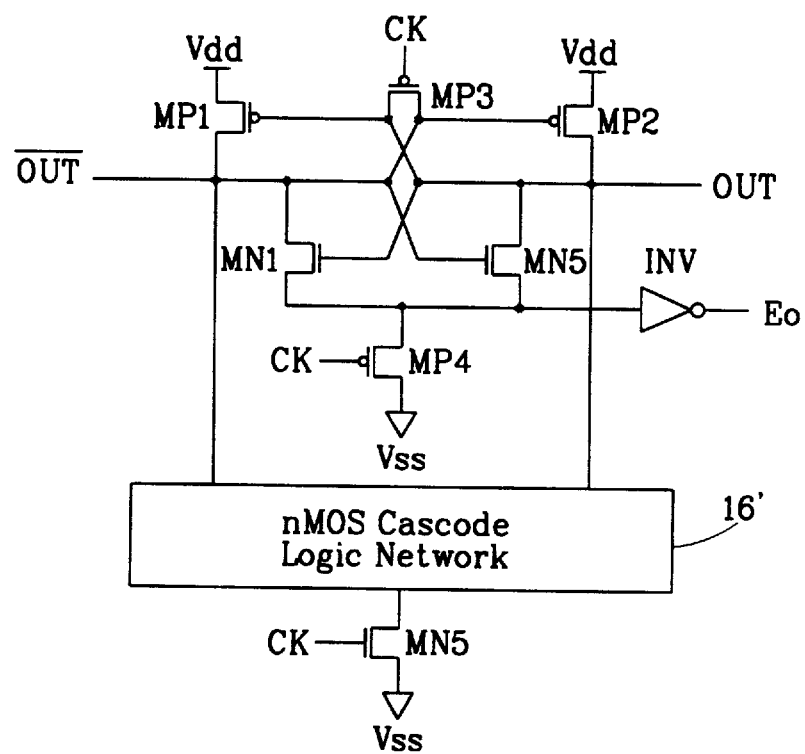

FIGS. 4C–4E illustrate different embodiments of the CRDL circuit. In the FIG. 4C embodiment, the transistors MN1, MP3, MP4 and MN5 of the FIG. 4A embodiment are replaced by the transistors MP3, MN1, MN5 and MP4, respectively, such that the CRDL circuit 10 operates in the precharge and evaluation phases when the clock signal is at low and high levels, respectively. The FIGS. 4D and 4E embodiments are similar to the FIGS. 4A and 4C embodiments. Instead of using an nMOS pass transistor logic network 16, the CRDL circuit of FIG. 4D uses an nMOS cascode logic networks 16'. Since there is no speed degradation in a cascode logic tree, the transistors MN2, MN3 and MN4 of FIG. 4A embodiment are eliminated, and an inverter INV and a transistor MP5 are added in the FIG. 4D embodiment.

Similarly, the CRDL circuit of FIG. 4E uses an nMOS cascode logic tree 16' and the transistors MN2, MN3 and MN4 of FIG. 4C are eliminated and an inverter INV and a transistor MN5 are added in the FIG. 4E. The transistors MP5 and MN5 of the FIGS. 4D and 4E embodiments prevent a leakage current of the nMOS cascode logic network. Based on the operational description of the FIG. 4A embodiment, the operation of the FIGS. 4C–4E is apparent to one of ordinary skill in the art, and the description thereof is omitted for simplicity.

As described above, the potential at the output nodes OUT and /OUT goes from Vdd to ½ (Vdd) to Vss or vice versa. Unlike the present invention, most conventional CMOS circuits require full voltage swing from Vdd to Vss or vise versa. Hence, the output nodes OUT and OUT require an interface to change the voltage swing level for use with conventional full swing logic circuits.

To interface the CRDL circuit 10 of the FIG. 4A and 4C–4E embodiments with conventional full-swing circuits, simple circuit structures illustrated in FIG. 5 can be used to recover a full-swing signal from the output of a CRDL circuit. The circuit in FIG. 5(a) uses only two transistors driven by a pair of complementary signals, and the circuit in FIG. 5(c) requires an additional transistor driven by the enable signal generated in a CRDL logic block. The outputs in both cases are precharged to Vdd as the input is around half-Vdd, and conditionally discharged when the input signal becomes stable. By using such a duality, circuits having 'zero-to-one' transition at the output nodes can be constructed, as shown in FIG. 5(b) and 5(d), respectively.

Figure 5A:
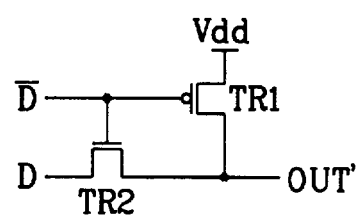
FIGS. 5(a)–5(d) are schematics of circuits for recovering a full signal swing from the output nodes of the CRDL circuit.

In the FIG. 5(a) circuit, the lines /D and D are coupled to the output nodes /OUT and OUT or vice versa. During the precharge phase, the potential on the lines /D and D is about ½(Vdd). Hence, the pMOS transistor TR1 is ON since the voltage difference between the gate and source is 2.5 V, which is larger than the threshold voltage of about 0.7 V. The nMOS transistor is off since the voltage difference between the gate and drain is about 0 V. Hence, the output signal OUT' reaches a source voltage of Vdd, e.g., 5 V. During the evaluation phase, when the potential on the lines /D and D increases to Vdd and Vss, respectively, the transistors TR1 and TR2 are off and on, respectively. Hence, the output signal OUT' transits to a low level of 0 V.

Figure 5B:
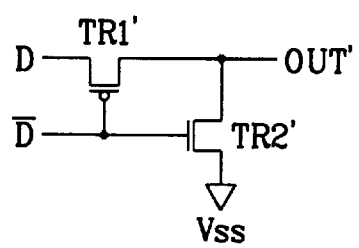

In the FIG. 5(b) circuit, when the potential on the lines /D and D is about ½(Vdd) during the precharge phase, the pMOS transistor TR1' and nMOS transistor TR2' turn off and on. Accordingly, the output signal OUT' goes to a low level of about 0 V. When the potential on the lines D and /D drops to Vdd and 0 V, respectively, during the evaluation phase, the transistors TR1' and TR2' are turned on and off, respectively, such that the output signal OUT' changes to a high level of Vdd.

Figure 5C:
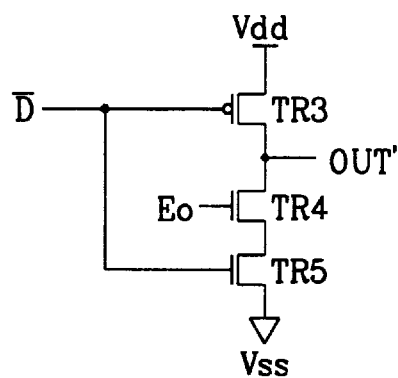

During the precharge phase, the potential on the line /D of FIG. 5(c) is about ½(Vdd). Since the transistor TR3 is turned on, the output signal OUT' reaches to Vdd. With the output signal OUT' being at a high level, and the output signal Eo being at a ground level, the transistor TR4 is turned off. In the evaluation phase, the potential on the line /D increases, and the transistors TR3 and TR5 are turned off and on, respectively. Since the output signal Eo of the CRDL circuit is at a high level, the transistor TR4 is turned ON. Hence, a current flows from the output OUT' to ground, and the output signal OUT' goes low.

Figure 5D:
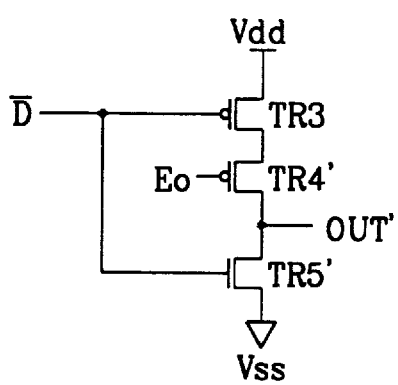

As per the FIG. 5(d) embodiment, the potential on the line /D is at a Vdd/2 level, and the inverted output signal /Eo is at a high level during the precharge phase. Hence, the transistors TR4' and TR5 are turned off and on, respectively, and the output signal OUT' goes to a low level. During the evaluation phase, the transistor TR3 and TR4' are on, since the potential on the line /D decreases to the ground level and the inverted output signal /Eo goes to a low level. The transistors TR3 and TR4' are turned on, and the output signal OUT' goes to Vdd.

The CRDL circuit has several important advantages over conventional dynamic logic circuits. The CRDL circuit uses a novel precharge scheme in which the charge used for the logic evaluation in a first cycle is recycled to establish a precharge value in the second subsequent cycle. Hence, the CRDL consumes less power than the conventional full-swing precharge circuits. In ideal situations, assuming that precise half-supply precharge level is achieved, the amount of power consumed by the CRDL circuit is about 50% less than a full-swing circuit.

The charge recycling operation also reduces di/dt noise on the supply lines, which sometimes a critical problem in conventional circuits. The CRDL circuit uses internally stored charge to precharge the output nodes during the precharge phase, resulting in a reduction in the amount of the current from the supply. Noise during the evaluation phase also decreases due to reduced voltage swing, resulting in smaller current to and from the supply lines.

Further, there is no noise-sensitive dynamic nodes in the gates. Although the operation of the CRDL circuit is based on the precharge and evaluation actions using a clock, all of the evaluated nodes are connected to either supply or ground rails leading to a static operation. Hence, the problems related to a dynamic node, such as degraded noise margin, are eliminated.

The CRDL circuit also has the advantages of the pass-transistor logic network to implement any random Boolean function. For example, XOR's can be implemented using only two pass-transistors. In the CRDL circuit, the devices needed for the pull-up function in the pass-transistor network can be eliminated since the cross-coupled transistors in the precharge circuitry perform such a function. Such an efficient implementation is particularly important since the key to reducing power dissipation and increasing speed of logic circuits is the reduction of the number of devices.

Figures 6A, 6B:
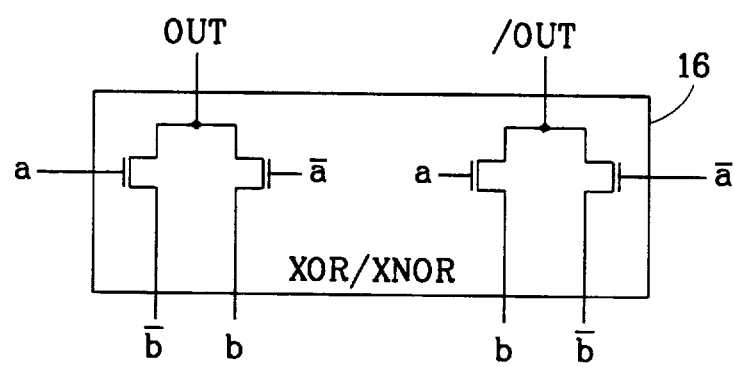
FIGS. 6(a) and 6(b) illustrate the pass transistor logic network for implementing the XOR/XNOR logic function and the logic table, respectively.
Figures 6C, 6D:
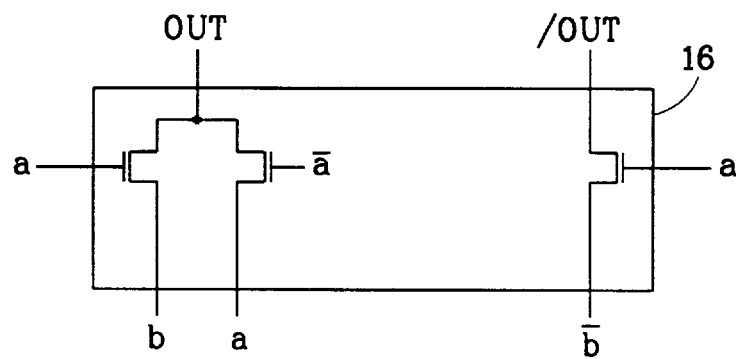
FIG. 6(c) and 6(d) illustrate the pass transistor logic network for implementing the AND/NAND logic function and the logic table, respectively.

FIGS. 6(a) and 6(c) illustrate the nMOS pass transistor logic network to implement the Boolean function of XOR/XNOR and AND/NAND gates. As shown in the logic table of FIGS. 6(b), the XOR function is accomplished by two pass transistors coupled to the output node OUT, and the XNOR function is accomplished by two pass transistors coupled to the output node /OUT. Similarly, as shown in the logic table of FIG. 6(d), the AND function is accomplished by two pass transistors coupled to the output node OUT, and the NAND is accomplished by a pass transistor coupled to the output node /OUT.

Figure 7A:
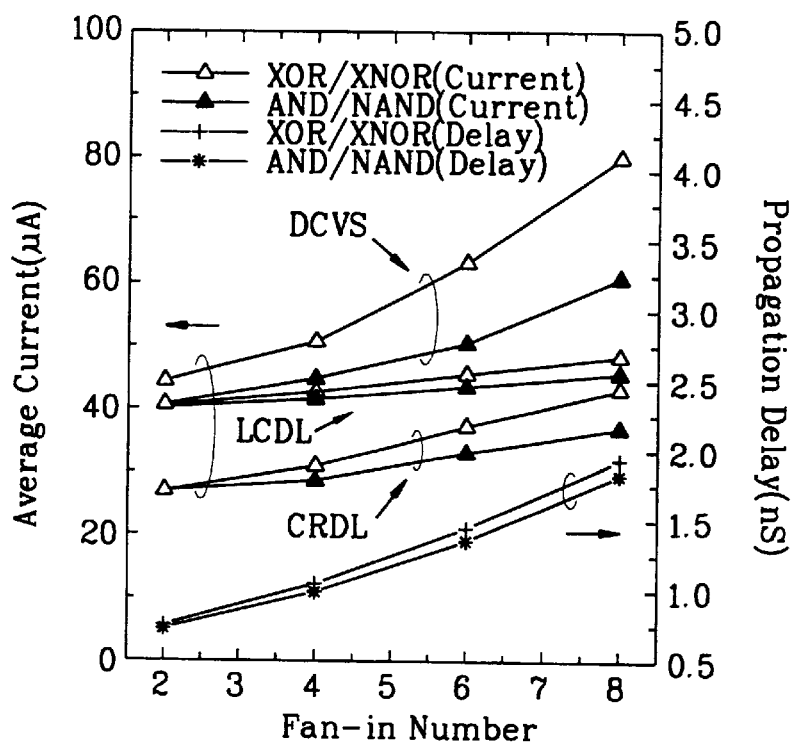
FIG. 7(a) illustrates comparison results of current consumption for XOR/XNOR and AND/NAND gates using DCVS, LCDL and CRDL circuits.
Figure 7B:
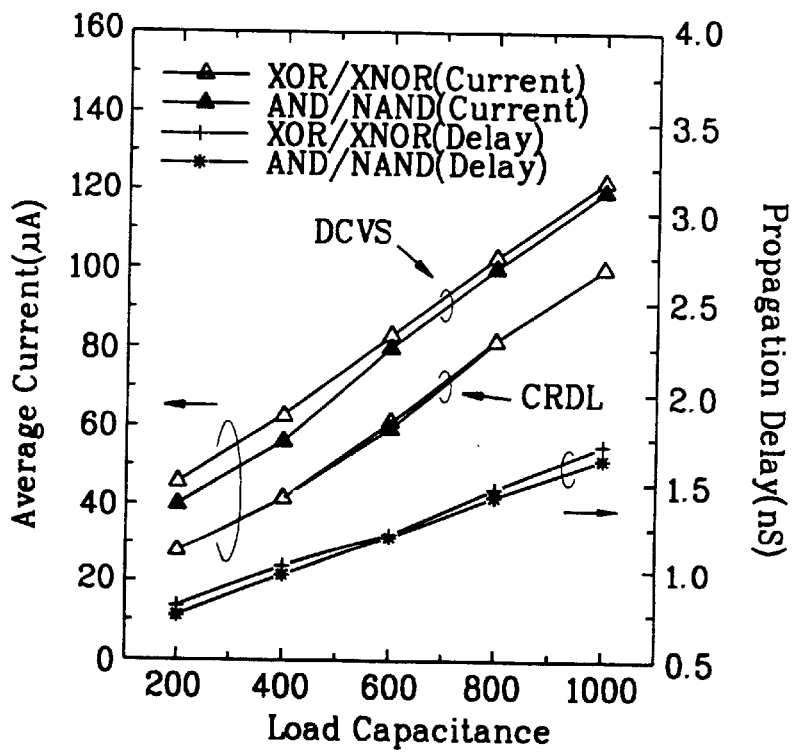
FIG. 7(b) illustrates current consumption of two input XOR/XNOR and AND/NAND gates using DCVS and CRDL circuits with changing load capacitance.

To verify the performance of the CRDL circuit, the current drawn from the supply rail is compared with those of the conventional logic types, such as DCVS and LCDL. The comparisons were done at a power supply of 5 V using HSPICE for several fan-in numbers and load capacitance values. FIG. 7(a) plots the current consumption of the XOR/XNOR and the AND/NAND gates implemented in each logic circuit with the fan-in number being changed from 2 to 8 at a load capacitance of 100 fF. FIG. 7(b) shows the same data with the load capacitance is changed over the range of 0.2~1 pF.

The propagation delays of all the logic styles for each Boolean function are made to be the same by device sizing for each fan-in number and load capacitance value, and are shown in the respective figure. From these figures, the CRDL circuit has the smallest current consumption among all the logic circuits, indicating that this logic type consumes the least amount of power.

Figure 8:
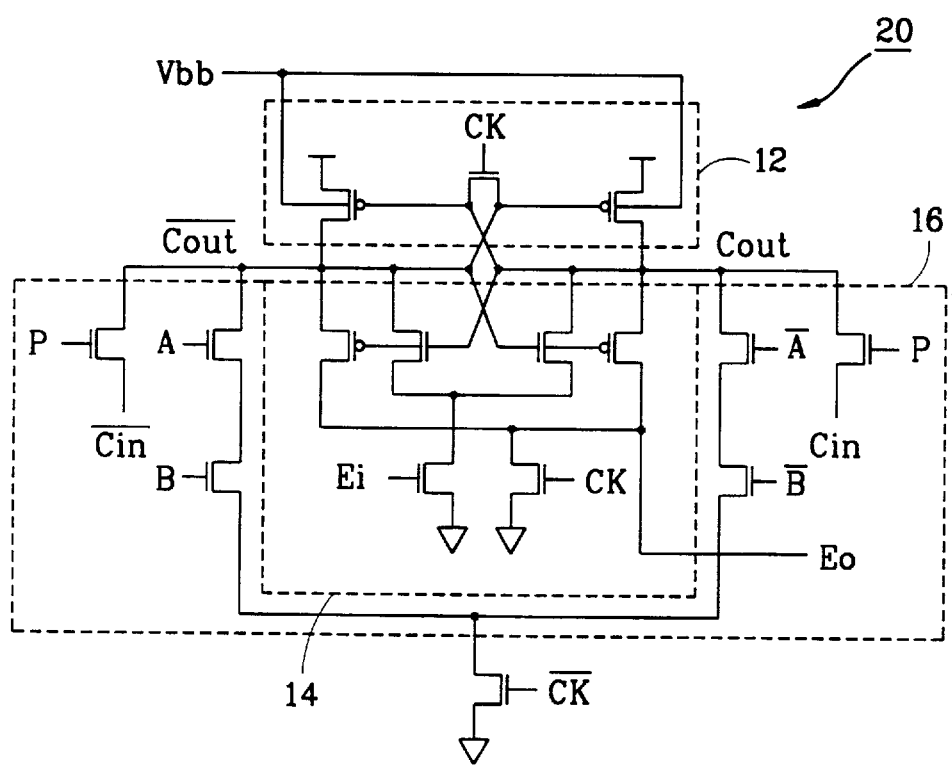
FIG. 8 is a schematic diagram of Manchester carry-chain using the CRDL circuit.

FIGS. 8 depicts a schematic diagram of a bit-sliced cell 20 of a Manchester carry-chain circuit. The cell 20 includes a precharging circuit 12, where the threshold voltage of the cross-coupled pMOS transistors is adjusted by a substrate bias Vbb, and an acceleration buffer 14. The output nodes serve as carry output nodes Cout and /Cout of the cell 20. As shown, the logic network 16 allows simple implementation to accomplish the bit-sliced cell 20 using nMOS transistors controlled by control and pass variables A, /A, B, /B and P and carry-in signals Cin and /Cin.

Figure 9A:
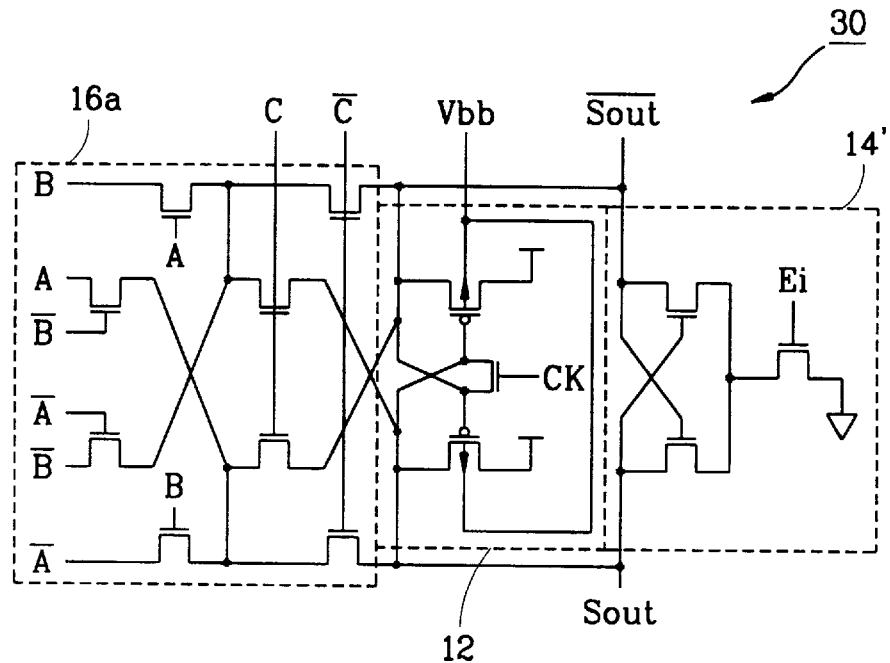
FIGS. 9(a) and 9(b) illustrate schematic diagrams of sum and carry circuits, respectively, of a full adder using the CRDL circuit.
Figure 9B:
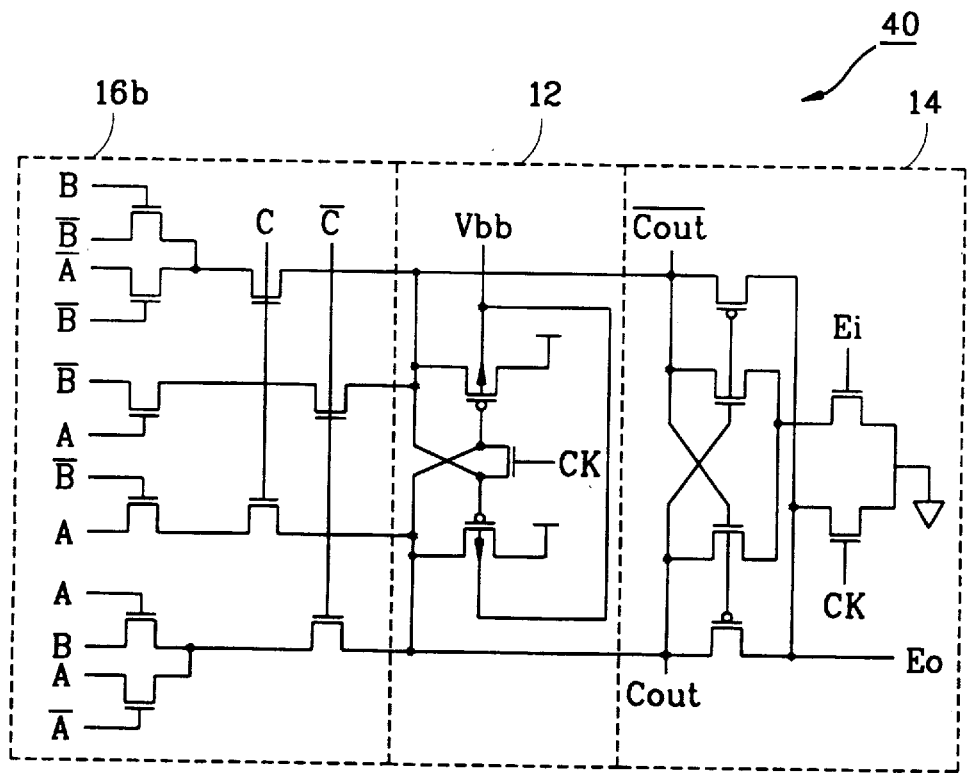

FIGS. 9(a) and 9(b) show the schematic diagram of a sum circuit 30 and a carry circuit 40, respectively, of a full adder. Both the sum circuit 30 and the carry circuit 40 include a precharging circuitry 12 and an acceleration buffer 14' or 14. As shown, the logic networks 16a and 16b easily implement the circuitry to implement the sum circuit 30 and carry circuit 40 using nMOS transistors controlled by control and pass variables A, /A, B, /B and carry-in signals C and /C. The output nodes of the CRDL circuit serve as sum out nodes Sout and /Sout and carry out nodes Cout and /Cout. The 8-bit carry chain is constructed by cascading this cell in series, as shown in FIG. 10.

Figure 10A:
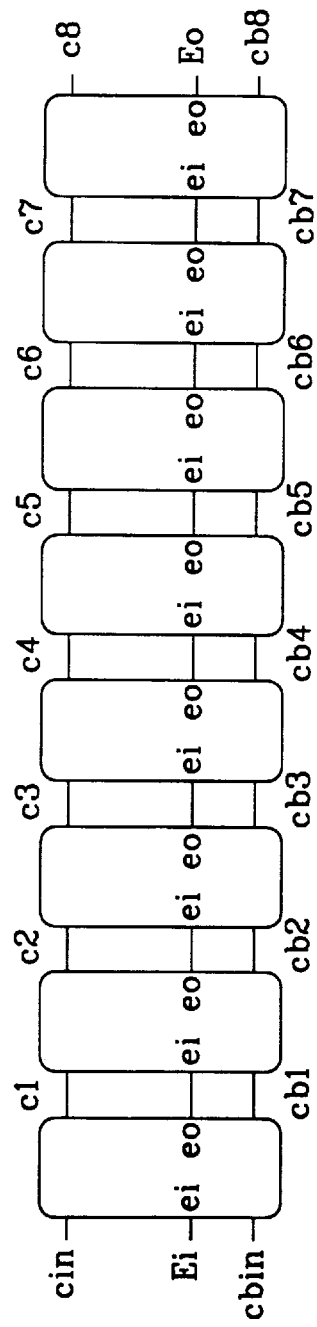
FIGS. 10(a) and 10(b) illustrate simple and optimized versions, respectively, of an 8-bit carry chain.
Figure 10B:
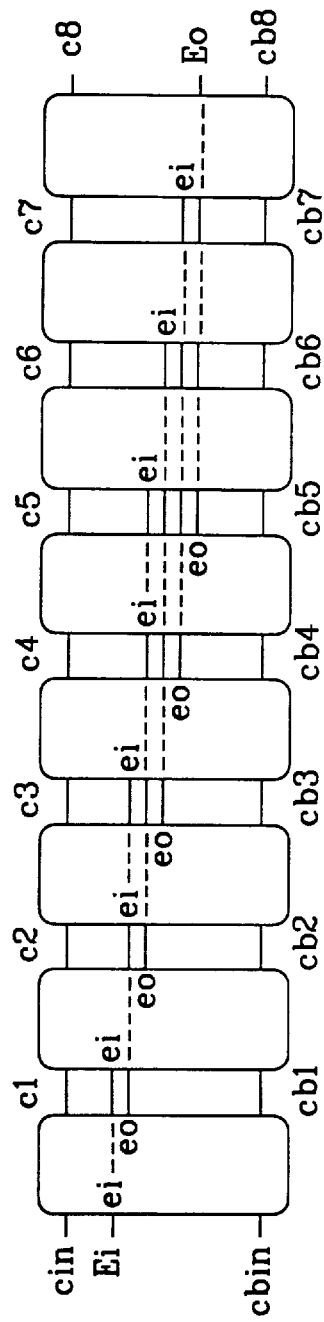

The simple version is shown in FIG. 10(a) in which the output signal Eo of the previous stage is used as the enable signal Ei. In this case, the CRDL circuit consumes approximately 23% less power with almost the same speed as the conventional one. The FIG. 10(b) shows the improved version where the interconnection of Eo is optimized. In other words, the output signal Eo of each stage is connected up to the next 4th stage to reduce the propagation delay by optimizing the timing for the activation of the buffer amplifier. With this connection, the speed improves approximately by 35% over the simple version without any additional power consumption.

In the conventional DCVS Manchester carry chain, carry look-ahead technique is used to speed up the operation. All the precharged dynamic nodes in conventional circuits are made static using a weak pMOS transistor to supply enough current to compensate for the leakage as well as to strengthen these nodes against the external noise. The experimental chip for these benchmark circuits was fabricated using the 0.8 µm single-poly double-metal n-well CMOS process. Because the threshold voltage adjustment was not feasible in this process, those of the cross-coupled pMOS transistors for the CRDL were adjusted by applying back-bias voltage so the precharged value was about 3.5 V.

Figure 11A:
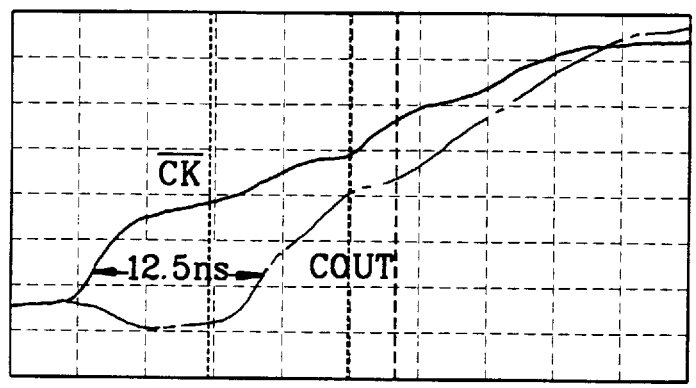
FIGS. 11(a) and 11(b) illustrate measured waveforms of an optimized six stage version of an 8-bit Manchester and a 32 stage full adder, respectively, using the CRDL circuit.
Figure 11B:
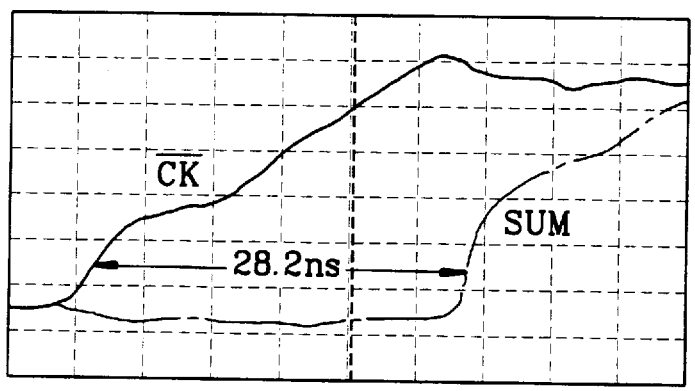

An 8-bit Manchester carry chains and full adders constructed of CRDL circuit and of DCVS circuit are designed as benchmark circuits to verify the performance of the proposed logic circuit. FIGS. 11(a) and (b) are the measured waveforms of the optimized Manchester carry chain and the full adder implemented using CRDL, respectively. There is only a 12.5 nanosecond delay between the clock signal /CK and an output at the carry out node Cout in the Manchester carry chain, and only a 28.2 nanosecond delay between the clock signal /CK and the output at the sum node.

Based on such measurements, the following Tables I(a) and (b) list the number of transistors, the average power, the worst-case propagation delay, and the calculated power-delay product of each of the logic circuits. The simple and the optimized carry chain with CRDL circuit in accordance with the present invention achieve about 21% and 48% improvements, respectively, in power-delay product over the DCVS circuit, as shown in Table I(a). The measurement result of full adder, which is shown in Table I(b), indicates that the new circuit improves power-delay product 16% over the conventional circuit.

TABLE I (a)

|  | Device Count | Delay (nSec) | Power (µW @ 10 MHz) | Power*Delay Product (fJ) |
|---|---|---|---|---|
| DCVS | 140 | 3.08 | 142 | 437 |
| CRDL | 128 | 3.17 | 109 | 346 |
| CRDL (opt.) | 128 | 2.08 | 109 | 226 |

TABLE I (b)

|  | Device Count | Delay (nSec) | Power (µW @ 10 MHz) | Power*Delay Product (fJ) |
|---|---|---|---|---|
| DCVS | 38 | 0.70 | 37.5 | 26.3 |
| CRDL | 33 | 0.88 | 25.0 | 22.0 |

To compare the performance with static CMOS logic circuits, the simulation results of static full adders together with that using DCVS and CRDL circuits are shown below in Table II. These simulations are performed at 10 MHz operating frequency including parasitic components extracted from the layout (the switching activities of static adders are around 50%). The result in the table shows that the static logic style has slightly better performance in terms of power delay product.

TABLE II

Simulation comparison between static and dynamic full adders.

|  | Device Count | Delay (nSec) | Power (µW @ 10 MHz) | Power*Delay Product (fJ) |
|---|---|---|---|---|
| Static CMOS | 40 | 1.65 | 11.0 | 18.2 |
| Pass-Tr. | 48 | 1.34 | 16.0 | 21.4 |
| DCVS | 38 | 0.75 | 32.4 | 24.3 |
| CRDL | 33 | 0.90 | 22.2 | 20.0 |

The static logic circuits have slower speed, and as a result, precharged circuit techniques are popularly used in high-speed applications due to their speed advantage although they consume larger power than the static logic. Moreover, since almost all of today's challenging low-power systems, such as portable cellular telephone or notebook computers, are simultaneously high-speed systems requiring many of these techniques, it is important to reduce as much power as possible in precharge logic circuits.

As described above, a novel logic circuit, called a CRDL circuit, and the devices using the same are disclosed above to meet the demands of current low-power high-speed VLSI systems. The CRDL circuit improves power efficiency by utilizing a charge recycling technique with comparable speed of the conventional precharged circuit. Due to inherently static operation, the noise margin is improved and the problems related to dynamic nodes are eliminated. Further, the CRDL circuit has less ground bouncing noise since the CRDL circuit recycles the internal charge. Moreover, the CRDL circuit has a smaller voltage swing as compared with the conventional precharge logic circuits.

The foregoing embodiment is merely exemplary and not to be construed as limiting the present invention. The present scheme can be readily applied to other types of logic cells and devices.

One of ordinary skill in the art can use the teachings of the present invention to other devices requiring reduced power consumption. The description of the present invention is intended to be illustrative, and not limiting the scope of the claims. Many alternatives, modifications and variations will be apparent to those skilled in the art.

I claim:

1. A logic circuit operating under a clock signal of first and second levels, comprising:

first and second nodes;

means for pulling-up said first node to a first potential when the clock signal transits from the first level to said second level;

means for pulling-down said second node to a second potential when the clock signal transits from the first level to the second level; and means for equalizing said first and second nodes to a third potential between said first and second potentials when the clock signal transits from the second level to the first level.

2. The logic circuit of claim 1, wherein said pulling-up means comprises a pair of cross-coupled transistors.

3. The logic circuit of claim 2, wherein said pair of cross-coupled transistor comprises:

a first transistor having a control electrode and first and second electrodes;

a second transistor having a control electrode and first and second electrodes, wherein said first electrodes of said first and second transistors receive a first predetermined source potential, said control electrode of said first transistor being coupled to said equalizing means and said second node, and said control electrode of said second transistor is coupled to said equalizing means and said first node.

4. The logic circuit of claim 3, wherein said equalizing means is a third transistor having a control electrode and first and second electrodes, said control electrode receiving the clock signal and said first and second electrodes coupled to said first and second transistors, respectively.

5. The logic circuit of claim 4, wherein said third transistor is an nMOS transistor.

6. The logic circuit of claim 3, wherein each of said first and second transistors has a threshold voltage higher than said third potential.

7. The logic circuit of claim 6, wherein said first and second transistors are pMOS transistors.

8. The logic circuit of claim 1, wherein said pull-down means is a passive transistor logic network for implementing a predetermined logic function.

9. The logic circuit of claim 1, wherein said pull-down means is a cascode logic network for implementing a predetermined logic function.

10. The logic circuit of claim 1, further comprising at least one of
a sense amplifier to accelerate a potential pull-down transition of said first and second nodes; and
means for generating an output signal.

11. The logic circuit of claim 10, wherein at least one of said sense amplifier and said generating means comprise fourth, fifth and sixth transistors, said fourth transistor being coupled to said first and second nodes, said fifth transistor being coupled to said first and second nodes, and said sixth transistor being coupled to said fourth and fifth transistors and receiving one of an enable signal and the clock signal.

12. The logic circuit of claim 11, wherein first and control electrodes of said fourth transistor are coupled to said first and second nodes, respectively, first and control electrodes of said fifth transistor are coupled said second and first nodes, respectively, and second electrodes of said fourth and fifth transistors are commonly coupled to a first electrode of said sixth transistor.

13. The logic circuit of claim 12, wherein a control electrode of said sixth transistor receives one of the enable signal and the clock signal and a second electrode of said sixth transistor is coupled to a predetermined second potential.

14. The logic circuit of claim 13, wherein said fourth, fifth and sixth transistors are nMOS transistors.

15. The logic circuit of claim 13, wherein said fourth and fifth transistors are pMOS transistors and said sixth transistor is an nMOS transistor.

16. The logic circuit of claim 1, wherein said third potential is about one half of a potential difference between said first and second potentials.

17. The logic circuit of claim 1, further comprising means for providing a potential swing between said first and second potentials in response to a potential swing from said third potential to one of said first and second potential.

18. A logic circuit comprising:
first and second nodes;
a pair of cross-coupled first and second transistors coupled to said first and second output nodes;
a third transistor coupled to said first and second transistors, said third transistor equalizing said first and second nodes to potentials which are about equal to one another; and
a logic network coupled to said first and second nodes for implementing a predetermined logic function, wherein each of said first, second and third transistors includes a first electrode, a second electrode and a control electrode, said control electrodes of said first and second transistors coupled to said first and second electrodes, respectively, of said third transistor and said control electrodes of said first and second transistors coupled to said second and first nodes, respectively, and second electrodes of said first and second transistors coupled to said first and second nodes, respectively, and the first electrode of said first and second transistors coupled for receiving a first predetermined source potential.

19. The logic circuit of claim 18, wherein said logic network is an nMOS passive transistor logic network.

20. The logic circuit of claim 18, wherein said logic network is an nMOS cascode logic network.

21. The logic circuit of claim 18, wherein each of said first and second transistors has a threshold voltage higher than said said potential of said first and second nodes which has been equalized by said third transistor.

22. The logic circuit of claim 18, wherein said third transistor is coupled for receiving a clock signal, said first transistor outputting a first potential at the first output node when said clock signal transits from a first level to a second level, said second transistor outputting a second potential at said second output node when said clock signal transits from the first level to the second level, and said third transistor equalizing said first and second output nodes to a third potential, which is between said first and second potentials, when the clock signal transits from the second level to the first level.

23. A method for recycling charges stored in first and second parasitic capacitors of first and second nodes, repectively, comprising the steps of:
pulling-up the first node to a first potential when a clock signal transits from a first level to a second level;
pulling-down the second node to a second potential when the clock signal transits from the first level to the second level; and
equalizing the first and second nodes to a third potential between said first and second potentials when the clock signal transits from the second level to the first level.

24. The method of claim 23 further comprising at least one of the steps of:
accelerating a potential pull-down transition of said first and second output nodes; and
generating an output signal.

25. A logic circuit comprising:
first and second nodes;
a pair of cross-coupled first and second transistors coupled to said first and second output nodes;
a third transistor coupled to said first and second transistors, said third transistor equalizing said first and second nodes to potentials which are about equal to one another;
a logic network coupled to said first and second nodes for implementing a predetermined logic function; and
at least one of a sense amplifier to accelerate a potential pull-down transition of said first and second nodes, and means for generating an output signal.

26. The logic circuit of claim 25, wherein at least one of said sense amplifier and said generating means comprise fourth, fifth and sixth transistors, said fourth transistor being coupled to said first and second nodes, said fifth transistor being coupled to said first and second nodes, and said sixth transistor being coupled to said fourth and fifth transistors and receiving one of an enable signal and an clock signal.

27. The logic circuit of claim 26, wherein first and control electrodes of said fourth transistor are coupled to said first and second nodes, respectively, first and control electrodes of said fifth transistor are coupled said second and first nodes, respectively, and second electrodes of said fourth and fifth transistors are commonly coupled to a first electrode of said sixth transistor.

28. The logic circuit of claim 27, wherein a control electrode of said sixth transistor receives one of the enable signal and the clock signal and a second electrode of said sixth transistor is coupled to a predetermined second potential.

29. The logic circuit of claim 28, wherein said fourth, fifth and sixth transistors are nMOS transistors.

30. The logic circuit of claim 28, wherein said fourth and fifth transistors are pMOS transistors and said sixth transistor is an nMOS transistor.

31. The logic circuit of claim 25, wherein said third transistor is coupled for receiving a clock signal, said first transistor outputting a first potential at the first output node when said clock signal transits from a first level to a second level, said second transistor outputting a second potential at said second output node when said clock signal transits from the first level to the second level, and said third transistor equalizing said first and second output nodes to a third potential, which is between said first and second potentials, when the clock signal transits from the second level to the first level.

32. A logic circuit comprising:
first and second nodes;
a pair of cross-coupled first and second transistors coupled to said first and second output nodes;
a third transistor coupled to said first and second transistors, said third transistor equalizing said first and second nodes to potentials which are about equal to one another; and
a logic network coupled to said first and second nodes for implementing a predetermined logic function, wherein said first and second transistors are pMOS transistors, and said third transistor is an nMOS transistor.

33. The logic circuit of claim 32, wherein said third transistor is coupled for receiving a clock signal, said first transistor outputting a first potential at the first output node when said clock signal transits from a first level to a second level, said second transistor outputting a second potential at said second output node when said clock signal transits from the first level to the second level, and said third transistor equalizing said first and second output nodes to a third potential, which is between said first and second potentials, when the clock signal transits from the second level to the first level.

* * * * *